US012603125B2

(12) United States Patent
Ivanov et al.

(10) Patent No.: US 12,603,125 B2
(45) Date of Patent: Apr. 14, 2026

(54) SELF-TIMING READ TERMINATION

(71) Applicant: Micron Technology, Inc., Boise, ID (US)

(72) Inventors: Milena Tsvetkova Ivanov, Munich (DE); Stefanie Christina Granato, Munich (DE); Jun Tan, Weißenfeld (DE); Varsha Mohan, Munich (DE); Manfred Hans Plan, Munich (DE); Martin Brox, Munich (DE); Morshed Mohammed, Freising (DE); Yu Ting Wu, Taichung (TW); Juan Antonio Garrido Ocon, Munich (DE)

(73) Assignee: Micron Technology, Inc., Boise, ID (US)

(*) Notice: Subject to any disclaimer, the term of this patent is extended or adjusted under 35 U.S.C. 154(b) by 111 days.

(21) Appl. No.: 18/763,964

(22) Filed: Jul. 3, 2024

(65) Prior Publication Data

US 2025/0022506 A1     Jan. 16, 2025

Related U.S. Application Data

(60) Provisional application No. 63/526,151, filed on Jul. 11, 2023.

(51) Int. Cl.
*G11C 11/40* (2006.01)
*G11C 11/4076* (2006.01)
*G11C 11/408* (2006.01)
*G11C 11/4096* (2006.01)

(52) U.S. Cl.
CPC ...... *G11C 11/4096* (2013.01); *G11C 11/4076* (2013.01); *G11C 11/4087* (2013.01)

(58) Field of Classification Search
CPC ............ G11C 11/4096; G11C 11/4076; G11C 11/4087; G11C 11/4091; G11C 11/4094
See application file for complete search history.

(56) References Cited

U.S. PATENT DOCUMENTS

| | | | | |
|---|---|---|---|---|
| 2015/0228329 A1* | 8/2015 | Park | ................. | G11C 11/40618 |
| | | | | 365/222 |
| 2022/0101905 A1* | 3/2022 | Bedeschi | ............... | G11C 7/065 |
| 2023/0289072 A1* | 9/2023 | Cho | ................. | G11C 11/40615 |

* cited by examiner

*Primary Examiner* — Mohammed A Bashar
(74) *Attorney, Agent, or Firm* — Holland & Hart LLP

(57) ABSTRACT

Methods, systems, and devices implementing self-timing read termination are described. A memory system may perform a read operation in which the memory system generates a first signal and a second signal to couple a first sense component and a second sense component with a global access line, respectively. The first sense component may be coupled with one or more memory cells via an access line, and the second sense component may be configured to determine one or more logic values of the one or more memory cells based on the coupling with the global access line. The memory system may support a self-timed termination of the first signal to decouple the first sense component from the global access line. The memory system may generate a third signal to terminate the first signal based on determining the one or more logic values.

20 Claims, 5 Drawing Sheets

105

Host System

Processor 125

Host System Controller 120

115

110

Memory System

Memory System Controller 140

Memory Device 145

Local Controller 150

Memory Array 155

• • •

Memory Device 145

Local Controller 150

Memory Array 155

100

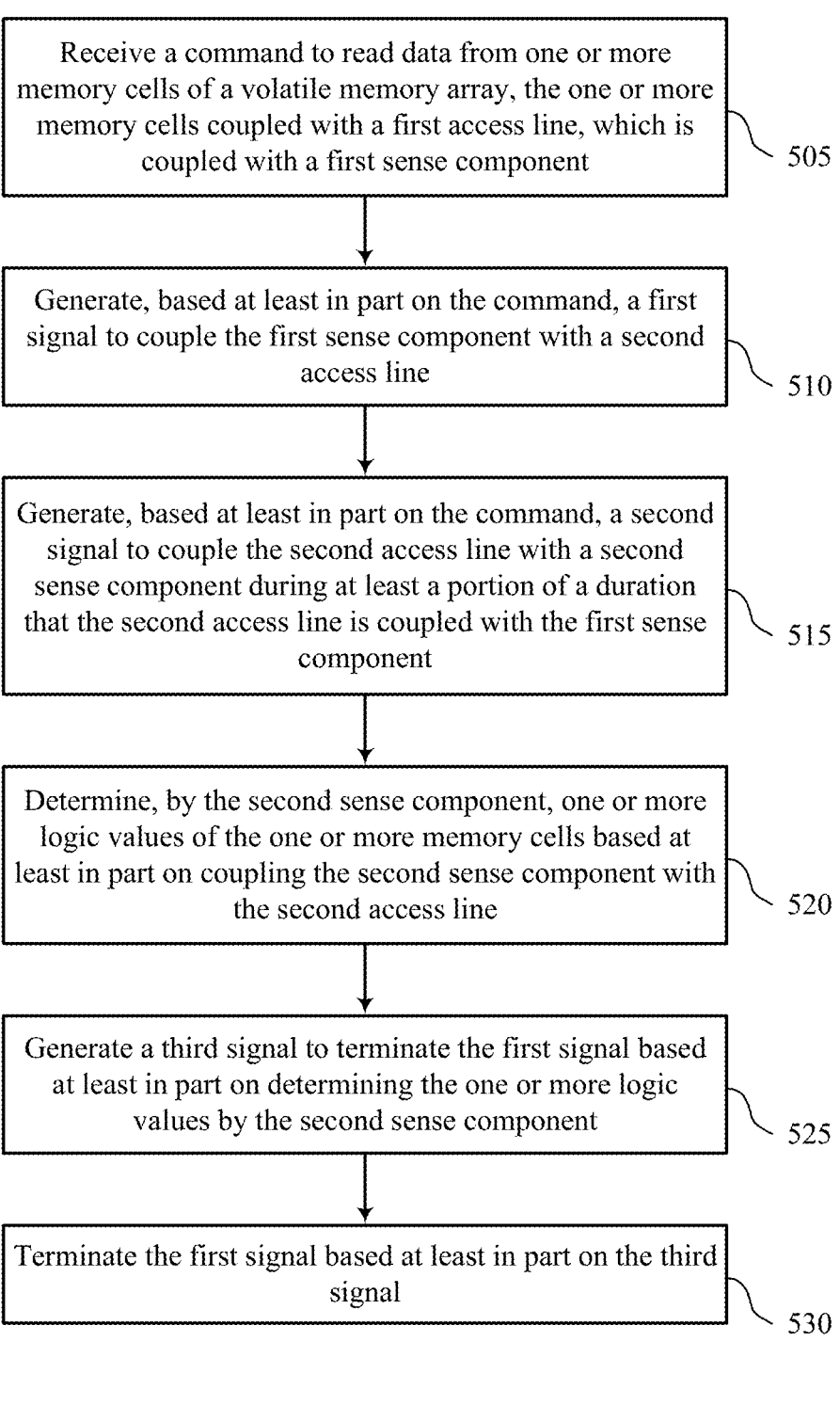

Receive a command to read data from one or more memory cells of a volatile memory array, the one or more memory cells coupled with a first access line, which is coupled with a first sense component

505

Generate, based at least in part on the command, a first signal to couple the first sense component with a second access line

510

Generate, based at least in part on the command, a second signal to couple the second access line with a second sense component during at least a portion of a duration that the second access line is coupled with the first sense component

515

Determine, by the second sense component, one or more logic values of the one or more memory cells based at least in part on coupling the second sense component with the second access line

520

Generate a third signal to terminate the first signal based at least in part on determining the one or more logic values by the second sense component

525

Terminate the first signal based at least in part on the third signal

SELF-TIMING READ TERMINATION

CROSS REFERENCE

The present application for patent claims priority to U.S. Patent Application No. 63/526,151 by Ivanov et al., entitled "SELF-TIMING READ TERMINATION," filed Jul. 11, 2023, which is assigned to the assignee hereof, and which is expressly incorporated by reference in its entirety herein.

TECHNICAL FIELD

The following relates to one or more systems for memory, including self-timing read termination.

BACKGROUND

Memory devices are used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored by the memory cell. To store information, a memory device may write (e.g., program, set, assign) states to the memory cells. To access stored information, a memory device may read (e.g., sense, detect, retrieve, determine) states from the memory cells.

BRIEF DESCRIPTION OF THE DRAWINGS

FIG. 5 shows a flowchart illustrating a method or methods that support self-timing read termination in accordance with examples as disclosed herein.

DETAILED DESCRIPTION

Figure 1:
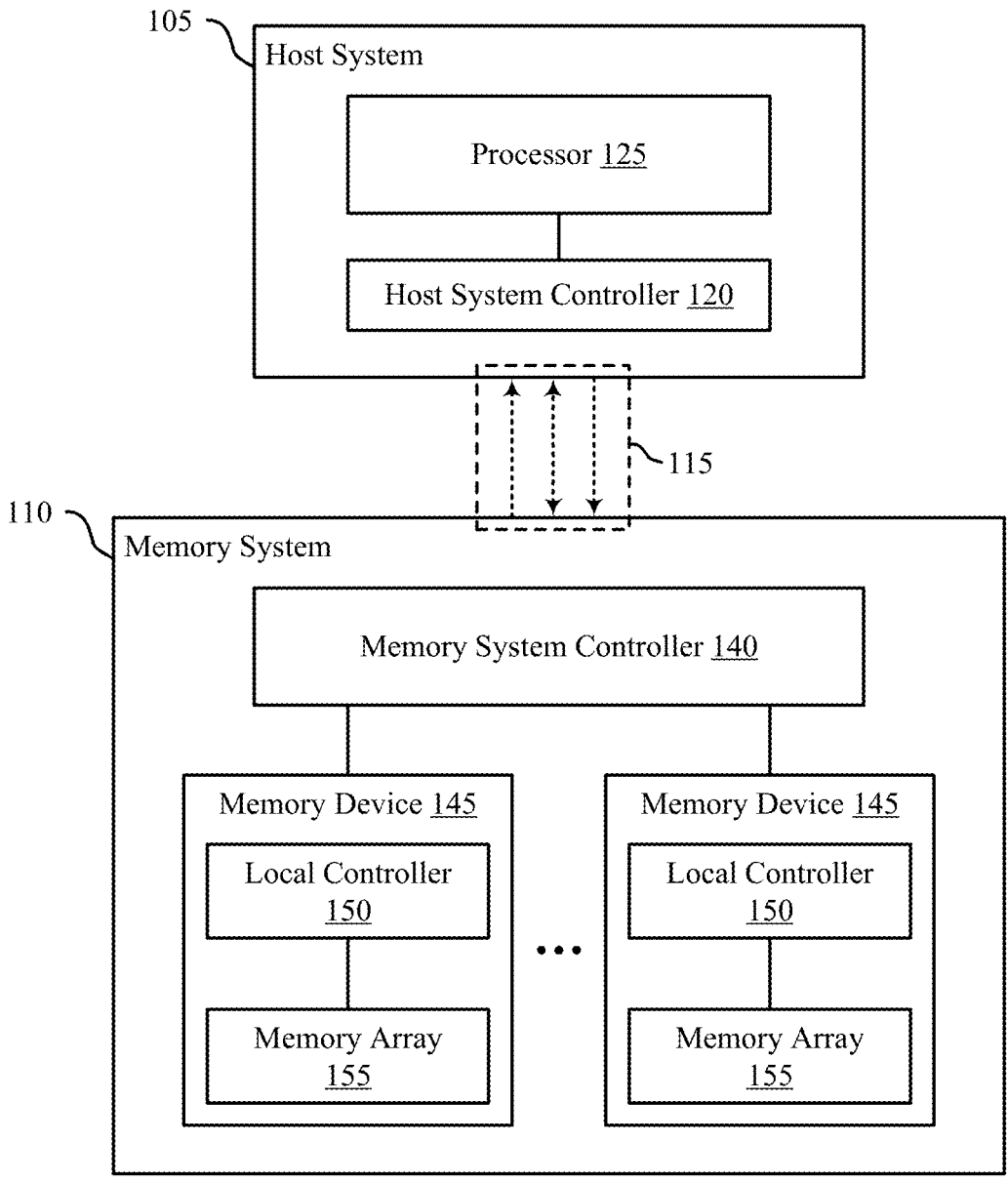
FIG. 1 shows an example of a system that supports self-timing read termination in accordance with examples as disclosed herein.

A memory system (e.g., including a volatile memory device, such as a dynamic random access memory (DRAM) device) may be configured to perform a read operation in response to a command (e.g., a read command) to read data from one or more memory cells (e.g., volatile memory cells, DRAM cells) of the memory system. As part of the read operation, a decoder (e.g., a column decoder) of the memory system may generate (e.g., output, transmit) a first signal (e.g., a column select signal) to couple a first sense component (e.g., a sense amplifier, of one or more first sense components) with a global access line. The first sense component may be coupled with the one or more memory cells, such as via a bit line and may output a signal (e.g., an amplified signal) on the global access line that is based on one or more logic values of the one or more memory cells. As part of the read operation, the decoder may generate a second signal (e.g., a read control signal) to couple a second sense component (e.g., a secondary sense amplifier) with the global access line. Based on coupling the first sense component with the second sense component with the global access line, the second sense component may evaluate the signal output on the global access line to determine the one or more logic values of the one or more memory cells. In some cases, the global access line may be pre-charged to an initial voltage prior to performing the read operation, and the global access line may be discharged as part of the read operation while the first sense component is coupled with the global access line. After the read operation, the global access line may be pre-charged to the initial voltage again to support a future read operation.

In some cases, a pulse width for the first signal may have a same width as a pulse width for the second signal. However, in some examples, the second sense component may support determining the one or more logic values of the one or more memory cells prior to an end of the first signal. In some such examples, the access line may be discharged throughout the duration of the first signal. Because the one or more logic values are determined prior to the end of the first signal, the global access line may be discharged for a duration longer than a duration to support determining the one or more logic values, thereby resulting in increased pre-charging and increased (e.g., wasted) power consumption.

In accordance with examples as described herein, a memory system may implement a self-timing pulse width of the first signal (e.g., a column select signal). For example, a duration of the first signal may be self-timed such that the duration of the first signal is based on a determination of logic values by the second sense component. For instance, the first signal may be terminated concurrently with determining the one or more logic values at the second sense component, such that the command to read the data may initiate (e.g., provide the initial edge of the pulse width) the first signal and the determination of the one or more logic values may end the first signal (e.g., trigger the final edge of the pulse width). In some cases, at determining (e.g., identifying, outputting) the one or more logic values, the second sense component may indicate to the decoder to terminate the first signal. In some other cases, a sensor coupled with the access line may detect a voltage of the access line satisfies a threshold associated with determining the one or more logic values, and the sensor may indicate to the decoder to terminate the first signal. By implementing self-timing termination of the first signal, discharging of a global access line as part of a read operation may be reduced, thereby reducing (e.g., shortening) pre-charging and reducing power consumption, such as power consumption associated with the read operation (e.g., power consumption associated with pre-charging the global access line to support a subsequent read operation), among other advantages.

Features of the disclosure are illustrated and described in the context of systems and architectures. Features of the disclosure are further illustrated and described in the context of sensing diagrams, a block diagram, and a flowchart.

FIG. 1 illustrates an example of a system 100 that supports self-timing read termination in accordance with examples as disclosed herein. The system 100 may include portions of an electronic device, such as a computing device, a mobile computing device, a wireless communications device, a graphics processing device, a vehicle, a smartphone, a wearable device, an internet-connected device, a vehicle controller, a system on a chip (SoC), or other stationary or portable electronic system, among other examples. The system 100 includes a host system 105, a memory system 110, and one or more channels 115 coupling the host system 105 with the memory system 110 (e.g., to support a communicative coupling). The system 100 may include any quantity of one or more memory systems 110 coupled with the host system 105.

The host system 105 may include one or more components (e.g., circuitry, processing circuitry, a processing component) that use memory to execute processes, any one or more of which may be referred to as or be included in a processor 125. The processor 125 may include at least one of one or more processing elements that may be co-located or distributed, including a general-purpose processor, a digital signal processor (DSP), an application-specific integrated circuit (ASIC), a field-programmable gate array (FPGA) or other programmable logic device, a controller, discrete gate or transistor logic, one or more discrete hardware components, or a combination thereof. The processor 125 may be an example of a central processing unit (CPU), a graphics processing unit (GPU), a general-purpose GPU (GPGPU), or an SoC or a component thereof, among other examples.

The host system 105 may also include at least one of one or more components (e.g., circuitry, logic, instructions) that implement the functions of an external memory controller (e.g., a host system memory controller), which may be referred to as or be included in a host system controller 120. For example, a host system controller 120 may issue commands or other signaling for operating the memory system 110, such as write commands, read commands, configuration signaling or other operational signaling. In some examples, the host system controller 120, or associated functions described herein, may be implemented by or be part of the processor 125. For example, a host system controller 120 may be hardware, instructions (e.g., software, firmware), or some combination thereof implemented by the processor 125 or other component of the host system 105. In various examples, a host system 105 or a host system controller 120 may be referred to as a host.

The memory system 110 provides physical memory locations (e.g., addresses) that may be used or referenced by the system 100. The memory system 110 may include a memory system controller 140 and one or more memory devices 145 (e.g., memory packages, memory dies, memory chips) operable to store data. The memory system 110 may be configurable for operations with different types of host systems 105, and may respond to commands from the host system 105 (e.g., from a host system controller 120). For example, the memory system 110 (e.g., a memory system controller 140) may receive a write command indicating that the memory system 110 is to store data received from the host system 105, or receive a read command indicating that the memory system 110 is to provide data stored in a memory device 145 to the host system 105, or receive a refresh command indicating that the memory system 110 is to refresh data stored in a memory device 145, among other types of commands and operations.

A memory system controller 140 may include at least one of one or more components (e.g., circuitry, logic, instructions) operable to control operations of the memory system 110. A memory system controller 140 may include hardware or instructions that support the memory system 110 performing various operations, and may be operable to receive, transmit, or respond to commands, data, or control information related to operations of the memory system 110. A memory system controller 140 may be operable to communicate with one or more of a host system controller 120, one or more memory devices 145, or a processor 125. In some examples, a memory system controller 140 may control operations of the memory system 110 in cooperation with the host system controller 120, a local controller 150 of a memory device 145, or any combination thereof. Although the example of memory system controller 140 is illustrated as a separate component of the memory system 110, in some examples, aspects of the functionality of the memory system 110 may be implemented by a processor 125, a host system controller 120, at least one of one or more local controllers 150, or any combination thereof.

Each memory device 145 may include a local controller 150 and one or more memory arrays 155. A memory array 155 may be a collection of memory cells (e.g., a two-dimensional array, a three-dimensional array), with each memory cell being operable to store data (e.g., as one or more stored bits). Each memory array 155 may include memory cells of various architectures, such as random access memory (RAM) cells, dynamic RAM (DRAM) cells, synchronous dynamic RAM (SDRAM) cells, static RAM (SRAM) cells, ferroelectric RAM (FeRAM) cells, magnetic RAM (MRAM) cells, resistive RAM (RRAM) cells, phase change memory (PCM) cells, chalcogenide memory cells, not-or (NOR) memory cells, and not-and (NAND) memory cells, or any combination thereof.

A local controller 150 may include at least one of one or more components (e.g., circuitry, logic, instructions) operable to control operations of a memory device 145. In some examples, a local controller 150 may be operable to communicate (e.g., receive or transmit data or commands or both) with a memory system controller 140. In some examples, a memory system 110 may not include a memory system controller 140, and a local controller 150 or a host system controller 120 may perform functions of a memory system controller 140 described herein. In some examples, a local controller 150, or a memory system controller 140, or both may include decoding components operable for accessing addresses of a memory array 155, sense components for sensing states of memory cells of a memory array 155, write components for writing states to memory cells of a memory array 155, or various other components operable for supporting described operations of a memory system 110.

A host system 105 (e.g., a host system controller 120) and a memory system 110 (e.g., a memory system controller 140) may communicate information (e.g., data, commands, control information, configuration information) using one or more channels 115. Each channel 115 may be an example of a transmission medium that carries information, and each channel 115 may include one or more signal paths (e.g., a transmission medium, an electrical conductor, a conductive path) between terminals (e.g., nodes, pins, contacts) associated with the components of the system 100. A terminal may be an example of a conductive input or output point of a device of the system 100, and a terminal may be operable as part of a channel 115. To support communications via channels 115, a host system 105 (e.g., a host system controller 120) and a memory system 110 (e.g., a memory system controller 140) may include receivers (e.g., latches) for receiving signals, transmitters (e.g., drivers) for transmitting signals, decoders for decoding or demodulating received signals, or encoders for encoding or modulating signals to be transmitted, among other components that support signaling via channels 115, which may be included in a respective interface portion of the respective system.

A channel 115 be dedicated to communicating one or more types of information, and channels 115 may include unidirectional channels, bidirectional channels, or both. For example, the channels 115 may include one or more command and address channels, one or more clock signal channels, one or more data channels, among other channels or combinations thereof. In some examples, a channel 115 may be configured to provide power from one system to another (e.g., from the host system 105 to the memory system 110, in accordance with a regulated voltage). In some examples, at least a subset of channels 115 may be configured in accordance with a protocol (e.g., a logical protocol, a communications protocol, an operational protocol, an industry standard), which may support configured operations of and interactions between a host system 105 and a memory system 110.

The memory system 110 (e.g., a memory device 145) may include one or more decoders configured to support performing a read operation in response to a read command (e.g., received from the host system 105). For example, a decoder (e.g., a column decoder) of the memory system 110 may generate (e.g., output, transmit) a first signal (e.g., a column select signal) to couple a first sense component (e.g., a sense amplifier, of one or more first sense components) with a global access line. The first sense component may be coupled with one or more memory cells of a memory array 155 (e.g., of the memory device 145), such as via a bit line, and may output a signal (e.g., an amplified signal) on the global access line that is based on one or more logic values of the one or more memory cells. As part of the read operation, the decoder may generate a second signal (e.g., a read control signal) to couple a second sense component (e.g., a secondary sense amplifier) with the global access line. Based on coupling the first sense component and the second sense component with the global access line, the second sense component may evaluate the signal output on the global access line to determine the one or more logic values of the one or more memory cells. In some cases, the global access line may be pre-charged to an initial voltage prior to performing the read operation, and the global access line may be discharged as part of the read operation while the first sense component is coupled with the global access line. After the read operation, the global access line may be pre-charged to the initial voltage again to support a future read operation.

In accordance with examples as described herein, the memory system 110 may implement a self-timing pulse width of the first signal (e.g., a column select signal). For example, a duration of the first signal may be self-timed such that the duration of the first signal is based on a determination of logic values by the second sense component. For instance, the first signal may be terminated concurrently with determining the one or more logic values at the second sense component, such that the command to read the data may initiate (e.g., provide the initial edge of the pulse width) the first signal and the determination of the one or more logic values may end the first signal (e.g., trigger the final edge of the pulse width). In some cases, at determining (e.g., identifying, outputting) the one or more logic values, the second sense component may indicate to the decoder to terminate the first signal. In some other cases, a sensor coupled with the access line may detect a voltage of the access line satisfies a threshold associated with determining the one or more logic values, and the sensor may indicate to the decoder to terminate the first signal. By implementing self-timing termination of the first signal, discharging of a global access line as part of a read operation may be reduced, thereby reducing (e.g., shortening) pre-charging and reducing power consumption, such as power consumption associated with the read operation (e.g., power consumption associated with pre-charging the global access line to support a subsequent read operation), among other advantages.

In addition to applicability in systems as described herein, techniques for self-timing read termination may be generally implemented to improve the performance (including gaming) of various electronic devices and systems. Some electronic device applications, including gaming and other high-performance applications, may be associated with relatively high processing requirements while also benefitting from relatively quick response times to improve user experience. As such, increasing processing speed, decreasing response times, decreasing power consumption, or otherwise improving the performance electronic devices may be desirable. Implementing the techniques described herein may improve the performance of electronic devices by reducing excessive power consumption associated with reading data of an electronic device (e.g., associated with pre-charging a global access line after completing a read operation), which may decrease power consumption of the electronic device, among other benefits.

Additionally, or alternatively, in addition to applicability in systems as described herein, techniques for self-timing read termination may be generally implemented to support artificial intelligence applications. As the use of artificial intelligence increases to support machine learning, analytics, decision making, or other related applications, electronic devices that support artificial intelligence applications and processes may be desired. For example, artificial intelligence applications may be associated with accessing relatively large quantities of data for analytical purposes and may benefit from memory devices capable of effectively and efficiently storing relatively large quantities of data or accessing stored data relatively quickly, such as with reduced power consumption. Implementing the techniques described herein may support artificial intelligence and/or machine learning techniques by decreasing power consumption for performing access operations, which may provide artificial intelligence implementations with power savings, among other benefits.

Figure 2:
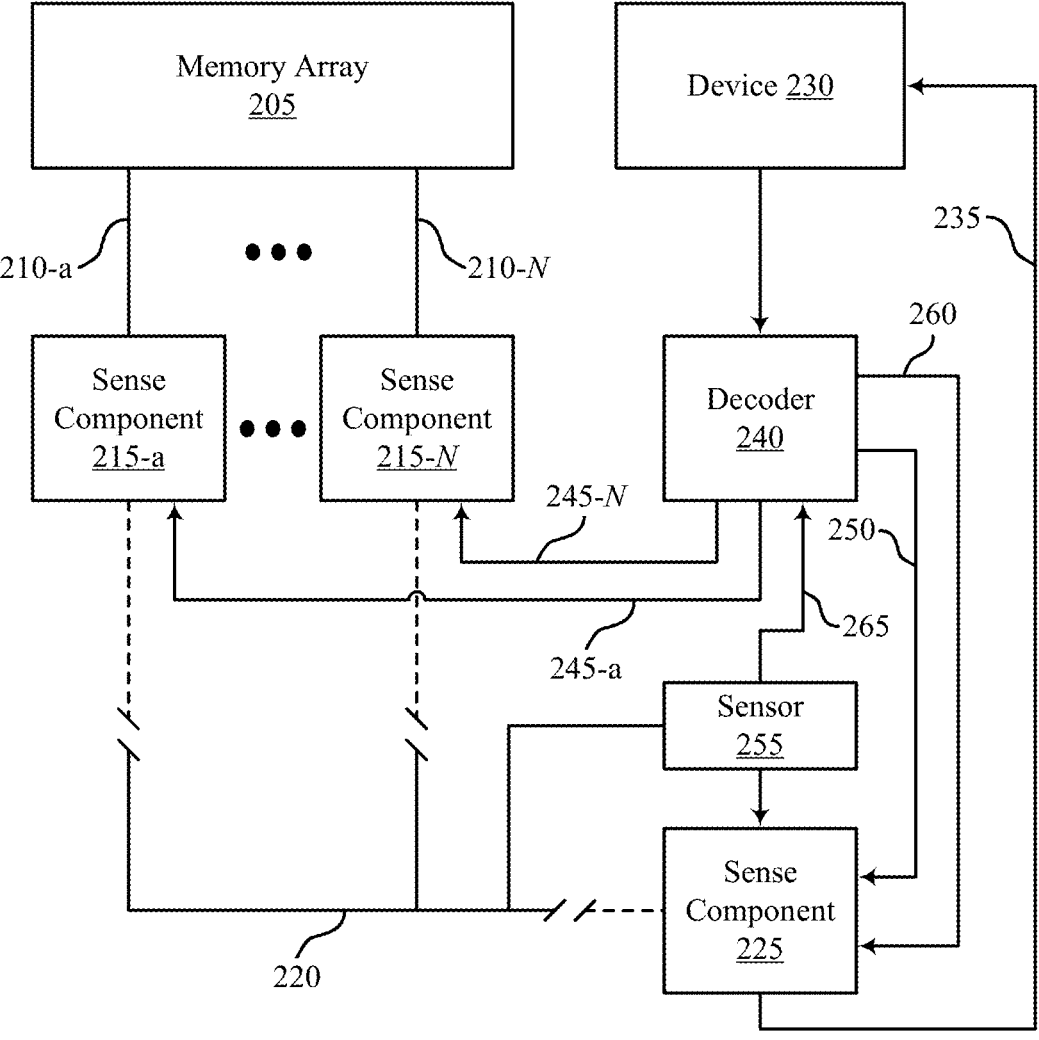
FIG. 2 shows an example of an architecture that supports self-timing read termination in accordance with examples as disclosed herein.

FIG. 2 shows an example of an architecture 200 that supports self-timing read termination in accordance with examples as disclosed herein. The architecture 200 may implement aspects or operations of a system 100 as described with reference to FIG. 1. For example, aspects of the architecture 200 may be implemented at a memory system, which may be an example of a memory system 110 (e.g., a memory device 145), as described herein, including with reference to FIG. 1. The architecture 200 may be configured to reduce excess power consumption (e.g., associated with pre-charging an access line 220 after completing a read operation) associated with performing a read operation.

The architecture 200 may include a memory array 205, which may be an example of a memory array 155, as described with reference to FIG. 1. The memory array 205 may include volatile memory cells (e.g., DRAM cells) each configured to store one or more bits of information (e.g., data). The memory array 205 may be coupled with access lines 210 (e.g., access lines 210-*a* through 210-N), which may be examples of bit lines (e.g., digit lines). For example, each access line 210 may be coupled with one or more memory cells of the memory array 205 and may be used to access (e.g., write data to, read data from) the one or more memory cells. In the example of FIG. 2, each access line 210 may also be coupled with a respective sense component 215 (e.g., an access line 210-*a* is coupled with a sense component 215-*a*, an access line 210-N is coupled with a sense component 215-N), where each sense component 215 may include one or more sense amplifiers. In some examples, a sense component 215 may be coupled with multiple access lines 210. A sense component 215 may be configured to sense a memory cell via a corresponding access line 210, such as part of (e.g., during) a read operation, and output an (e.g., amplified) signal (e.g., an analog signal) that is based on (e.g., corresponds to) a logic value (e.g., a logic state) of the memory cell.

The architecture 200 may include an access line 220, which may be referred to as a global bit line (e.g., a global data line). For example, the access line 220 may be operable to couple with each of the sense components 215 (e.g., each of the access lines 210), and thereby support accessing each of the memory cells of the memory array 205. For instance, the access line 220 may be operable to couple with a sense component 215 and may be configured to carry a signal output from the sense component 215 that indicates one or more logic values of one or more memory cells coupled with the sense component 215. In some examples, the access lines 210 may be referred to as a local bit lines (e.g., local access lines, local data lines), for example, due to being coupled with a local subset of memory cells of the memory array 205.

Additionally, the access line 220 may be operable to couple with a sense component 225, where the sense component 225 is configured to determine the one or more logic values based on the signal output by the sense component 215. For example, the sense component 225 may amplify the signal output by the sense component 215 and use the amplified signal to determine a corresponding logic value (e.g., based on a comparison to one or more reference voltages). In some examples, the sense component 225 may convert the analog signal to a digital signal representing (e.g., indicating) the one or more corresponding logic values. The sense component 225 may be configured to output (e.g., transmit) the one or more logic values to a device 230 (e.g., during the read operation) via a read line 235 (e.g., a read data line). In some cases, the device 230 may be an example of a host system 105, a host system controller 120, a memory system controller 140, or a local controller 150, as described with reference to FIG. 1.

The architecture 200 may include a decoder 240 (e.g., a column decoder) operable to couple a sense component 215 with the access line 220. For example, the architecture 200 may include a respective column select line 245 (e.g., a column select line 245-*a*, a column select line 245-N) between the decoder 240 and each sense component 215, where each column select line 245 is configured to transfer signaling from the decoder 240 to the respective sense component 215 (e.g., the column select line 245-*a* may transfer signaling to the sense component 215-*a*, the column select line 245-N may transfer signaling to the sense component 215-N). In some such examples, the decoder 240 may transmit a signal (e.g., a column select signal), via a column select line 245 (e.g., the column select line 245-*a*) to one of the sense components 215 (e.g., the sense component 215-*a*) to couple the sense component 215 with the access line 220.

The decoder 240 may be operable to couple the sense component 225 with the access line 220. For example, the architecture 200 may include a read control line 250 between the decoder 240 and the sense component 225, where the read control line 250 is configured to transfer signaling (e.g., a read control signal) between the decoder 240 and the sense component 225. The decoder 240 may be coupled with the device 230 and may be configured to receive commands (e.g., access commands) from the device 230. In some examples, the device 230 may transmit (e.g., issue) commands to one or more controllers of a memory system that includes the decoder 240 (e.g., a memory system controller 140, a local controller 150), which may use (e.g., operate, issue commands to) the decoder 240 in accordance with the commands received from the device 230, for example, to access the memory array 205. In some examples, the decoder 240 may be configured to transmit signaling to the sense components 215 and/or the sense component 225 based on receiving commands from the device 230 (e.g., via the one or more controllers).

The architecture 200 may include a sensor 255 coupled with the access line 220, the sense component 225, the decoder 240, or any combination thereof. The sensor 255 may be configured to detect (e.g., monitor) a voltage (e.g., a voltage value, a change in voltage) of the access line 220 and transmit respective signaling to the sense component 225 and/or the decoder 240 based on determining whether the voltage satisfies a threshold (e.g., a voltage threshold, a change in the voltage satisfies a threshold voltage change). For example, the sensor 255 may be configured to transmit an indication to the sense component 225 to transmit the one or more logic values determined at the sense component 225 based on determining that the voltage of the access line 220 satisfies the threshold. For instance, the voltage satisfying the threshold may indicate that the access line 220 has reached a voltage at which the sense component 225 is able to determine the one or more logic values, and the sensor 255 may transmit the indication for the sense component 225 to fire (e.g., transmit the one or more logic values) accordingly. Additionally, or alternatively, the sensor 255 may be configured to transmit signaling to the decoder 240 indicating the decoder 240 to terminate signaling to a sense component 215 that couples the sense component 215 with the access line 220.

In some cases, the architecture 200 may support performing a read operation to read data from one or more memory cells of the memory array 205. For example, the device 230 may transmit a read command to the decoder 240 to read data from one or more memory cells of the memory array 205. For example, the read command may be for data in one or more memory cells coupled with the access line 210-*a*. In response to receiving the read command, the decoder 240 may generate and transmit a column select signal (e.g., a first signal) to the sense component 215-*a* via the column select line 245-*a*. Additionally, the decoder 240 (e.g., or another decoder coupled with the sense component 225) may generate and transmit a read control signal (e.g., a second signal) to the sense component 225 via the read control line 250. Reception of the column select signal at the sense component 215-*a* may couple the sense component 215-*a* with the access line 220, and the sense component 215-*a* may remain coupled with the access line 220 while the column select signal is asserted (e.g., being transmitted). For example, the column select signal may activate a switch (e.g., at the sense component 215-*a*, coupled with the sense component 215-*a*) that couples the sense component 215-*a* with the access line 220. Similarly, reception of the read control signal at the sense component 225 may couple the sense component 225 with the access line 220 (e.g., via activation of a switch at the sense component 225 or coupled with the sense component 225), and the sense component 225 may remain coupled with the access line 220 while the read control signal is asserted.

Coupling the sense component 215-a and the sense component 225 with the access line 220 may enable the sense component 215-a to transmit the data (e.g., signaling indicating one or more logic values of the one or more memory cells) to the sense component 225, such that the sense component 225 may sense the data (e.g., determine the one or more logic value). Based on determining the one or more logic values, the sense component 225 may transmit the one or more logic values to the device 230 via the read line 235.

To support power savings in association with reading data from the memory array 205, the column select signal may be terminated according to various techniques based on determining the one or more logic values at the sense component 225. In some examples, the sense component 225 may support the termination of the column select signal, such as via a feedback line 260 (e.g., a conductive line between the sense component 225 and the decoder 240). For example, the sense component 225 may transmit a signal (e.g., a third signal) to the decoder 240 via the feedback line 260 based on (e.g., in response to, concurrent with) determining the one or more logic values or transmitting the one or more logic values to the device 230. The signal may indicate the decoder 240 to terminate the column select signal. In some examples, the signal may include an indication to stop transmitting the column select signal, that the logic values have been determined, or that the logic values have been transmitted to the device 230, which may indicate for the decoder 240 to terminate (e.g., stop, end) the column select signal.

In some examples, the sensor 255 may support the termination of the column select signal, such as via a feedback line 265 (e.g., a conductive line between the sensor 255 and the decoder 240). For example, the sensor 255 may determine the voltage (e.g., or a change of the voltage) of the access line 220 satisfies a threshold voltage (e.g., a threshold voltage change), and the sensor 255 may transmit a signal (e.g., the third signal) via the feedback line 260 to the decoder 240 to terminate the column select signal. In some examples, determining the voltage satisfies the threshold may include detecting the voltage of the access line 220 has dropped to or below a threshold voltage. In some examples, determining the voltage satisfies the threshold may include determining that the change in the voltage of the access line 220 (e.g., from the beginning of the read operation, from an initial pre-charged voltage of the access line 220) meets or exceeds the threshold voltage change. In some examples, based on (e.g., in response to, concurrent with) determining the voltage of the access line 220 satisfies the threshold, the sensor 255 may transmit a signal to the sense component 225 indicating the sense component 225 to fire (e.g., determine the one or more logic values and/or transmit the one or more logic values to the device 230).

After receiving the signal (e.g., from the sense component 225 or the sensor 255), the decoder 240 may terminate the column select signal, thereby decoupling the sense component 215-a from the access line 220. In some cases, after terminating the column select signal, or after the one or more logic values are determined, the decoder 240 may terminate the read control signal, thereby decoupling the sense component 225 from the access line 220.

Terminating the column select signal based on determining the one or more logic values may support ending the column select signal prior to a time in which the column select signal may otherwise finish (e.g., if the column select signal is otherwise terminated based on a deterministic timing scheme, such as being synchronous with an external clock or based on an internal delay-based pulse generator).

Further, maintaining the coupling of the access line 220 may be increase power consumption due to additional discharging of the access line, such that terminating the column select signal may decouple the access line 220, thereby resulting in power savings for a memory system implementing the architecture 200. That is, because terminating the column select signal may occur at an earlier time than if terminated based on a deterministic timing scheme, the memory system may save power otherwise associated with maintaining the coupling of the access line 220.

Figure 3A:
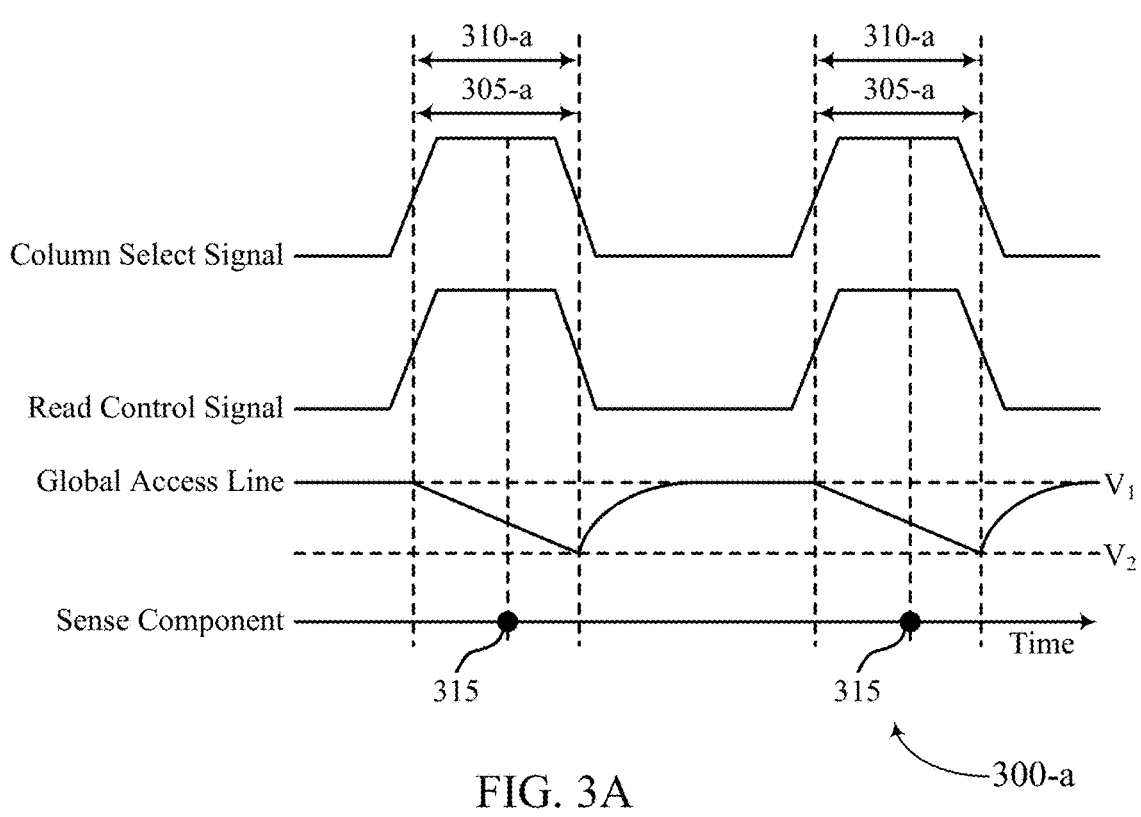
FIGS. 3A and 3B show examples of sensing diagrams that supports self-timing read termination in accordance with examples as disclosed herein.
Figure 3B:
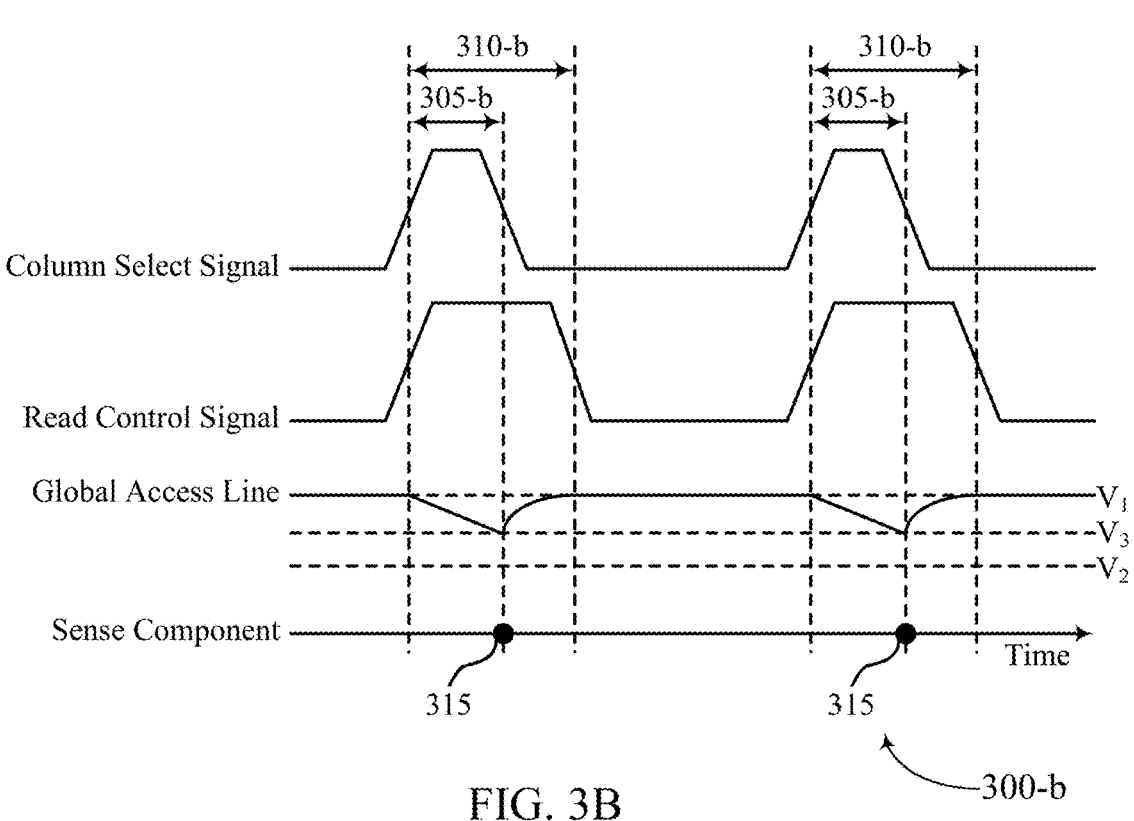

FIGS. 3A and 3B show examples of sensing diagrams 300-a and 300-b that support self-timing read termination in accordance with examples as disclosed herein. The sensing diagrams 300-a and 300-b may each implement aspects or show operations of an architecture 200, as described with reference to FIG. 2. For example, the sensing diagrams 300-a and 300-b illustrate pulse widths for a column select signal and a read control signal, as described with reference to FIG. 2. Additionally, the sensing diagrams 300-a and 300-b depict a voltage level of a global access line and detection points of a sense component, which may be example of an access line 220 and a sense component 225, respectively, as described with reference to FIG. 2. Specifically, the sensing diagram 300-a illustrates operations of a read circuit that does not implement self-timing read termination, as described herein, whereas the sensing diagram 300-b illustrates operations of the architecture 200, which implements self-timing read termination.

The sensing diagrams 300-a and 300-b each depict the column select signal being transmitted via a column select line 245, as described with reference to FIG. 2. The sensing diagrams 300-a and 300-b each show two pulses (e.g., two transmissions, two read operations) of the column select signal, each with a pulse width 305 (e.g., pulse width 305-a, pulse width 305-b). Also, the sensing diagrams 300-a and 300-b each show the read control signal being transmitted via a read control line 250, as described with reference to FIG. 2. The sensing diagrams 300-a and 300-b each show two pulses (e.g., two transmissions, two read operations) of the read control signal, each with a pulse width 310 (e.g., pulse width 310-a, pulse width 310-b). Each pulse width 305 and 310 may include a rising edge and a falling edge, which may represent an initialization and a termination of the respective signals, respectively. For example, the sensing diagrams 300-a and 300-b depict the column select signal beginning concurrently with read control signal.

Referring to FIG. 3A, the sensing diagram 300-a depicts the column select signal and the read control signal having equal pulse widths 305-a and 310-a, such that the column select signal and the read control signal may be applied for a same duration during each read operation. In some cases, the pulse widths 305-a and 310-b may be equal due to the pulse widths 305-a and 310-b being synchronous with an external clock (e.g., a clock signal). In some other cases, the pulse widths 305-a and 310-b may be equal due to the pulse widths 305-a and 310-b being asynchronous, yet generated by an internal delay-based pulse generator. The sense component may determine one or more logic values for the respective read operation at time 315, which may occur during the pulse widths 305-a and 310-b (e.g., before a falling edge of the column select signal and the read control signal).

Referring to FIG. 3B, the sensing diagram 300-b depicts the column select signal and the read control signal having different pulse widths 305-b and 310-b, due to the sensing diagram 300-b illustrating the read operation being performed by the architecture 200, which implements self-timing read termination, as described with reference to FIG. 2. Accordingly, the pulse width 305-b may be less than the pulse width 310-b because the architecture 200 may be configured to terminate the column select signal concurrently with the sense component determining the one or more logic values for the respective read operation. That is, the sense component may determine the one or more logic values at a time 315 which may occur during the pulse width 310-b, yet the architecture 200 may terminate the column select signal at time 315, thereby ending the pulse width 305-b at a time prior to the pulse width 310-b ending. In some cases, self-timing termination of the column select signal may result in power savings otherwise associated with maintaining the column select signal after the one or more logic values are sensed.

The sensing diagrams 300-a and 300-b each depict a voltage of the global access line during application of the two pulses of the column select signal and the read control signal. For example, before applying the column select signal, the global access line may be pre-charged (e.g., by a decoder) to a voltage corresponding to a first voltage level $V_1$. Then, during application of the column select signal, the global access line may be discharged to support transmitting one or more voltages (e.g., a signal representative of logic values stored by one or more memory cells) to the sense component that may determine the one or more logic values from the one or more voltages at time 315. After the column select signal is finished, the global access line may be pre-charged back to the first voltage level $V_1$.

The sensing diagram 300-a illustrates the column select signal being terminated concurrent with the read control signal, and the sensing diagram 300-b illustrates the column select signal being terminated based on (e.g., concurrent with) determining the one or more logic values at time 315. Thus, the sensing diagram 300-a depicts the global access line continuing to discharge after time 315, until the end of the column select signal and the read control signal (e.g., the pulse widths 305-a and 305-b). For example, the sensing diagram 300-a depicts the global access line discharging to a voltage corresponding to a second voltage level $V_2$. The sensing diagram 300-b depicts the global access line stopping discharging at time 315, which represents the termination of the column select signal (e.g., the pulse width 305-b). For example, the sensing diagram 300-b depicts the global access line discharging to a voltage corresponding to a third voltage level $V_3$, which may have a magnitude greater than the second voltage level $V_2$. In some cases, the third voltage level $V_3$ may correspond to a voltage at which the one or more logic values are determined. In some such cases, the third voltage level $V_3$ may represent a voltage at which the voltage of the global access line satisfies a threshold, or may correspond to a threshold at which a difference between the first voltage level $V_1$ and the voltage of the global access line satisfies a threshold. In some examples, based on the voltage of the global access line reaching (e.g., dropping to) the third voltage level $V_3$, the sense component may indicate to a decoder 240 to terminate the column select signal. In some other examples, a sensor 255 coupled with the global access line may detect the voltage of the global access line has reached the third voltage level $V_3$, and the sensor 255 may indicate to the decoder 240 to terminate the column select signal.

In some examples, discharging the global access line may be associated with relatively high power consumption due to a high capacitance of the global access line (relative to other conductive lines). In some such examples, because the global access line ceases to discharge at time 315 in the sensing diagram 300-b, a memory system implementing read operations of the sensing diagram 300-b may benefit from decreased power consumption otherwise associated with continuing to discharge the global access line (e.g., as illustrated in the sensing diagram 300-a). For example, in the sensing diagram 300-a, the global access line is discharged to the second voltage level $V_2$, whereas in the sensing diagram 300-b, the global access line is discharged to the third voltage level $V_3$. Thus, in the sensing diagram 300-b, the global access line is discharged for a relatively shorter duration and to a relatively higher voltage than in the sensing diagram 300-a, thereby consuming relatively less power than in the sensing diagram 300-a.

Figure 4:
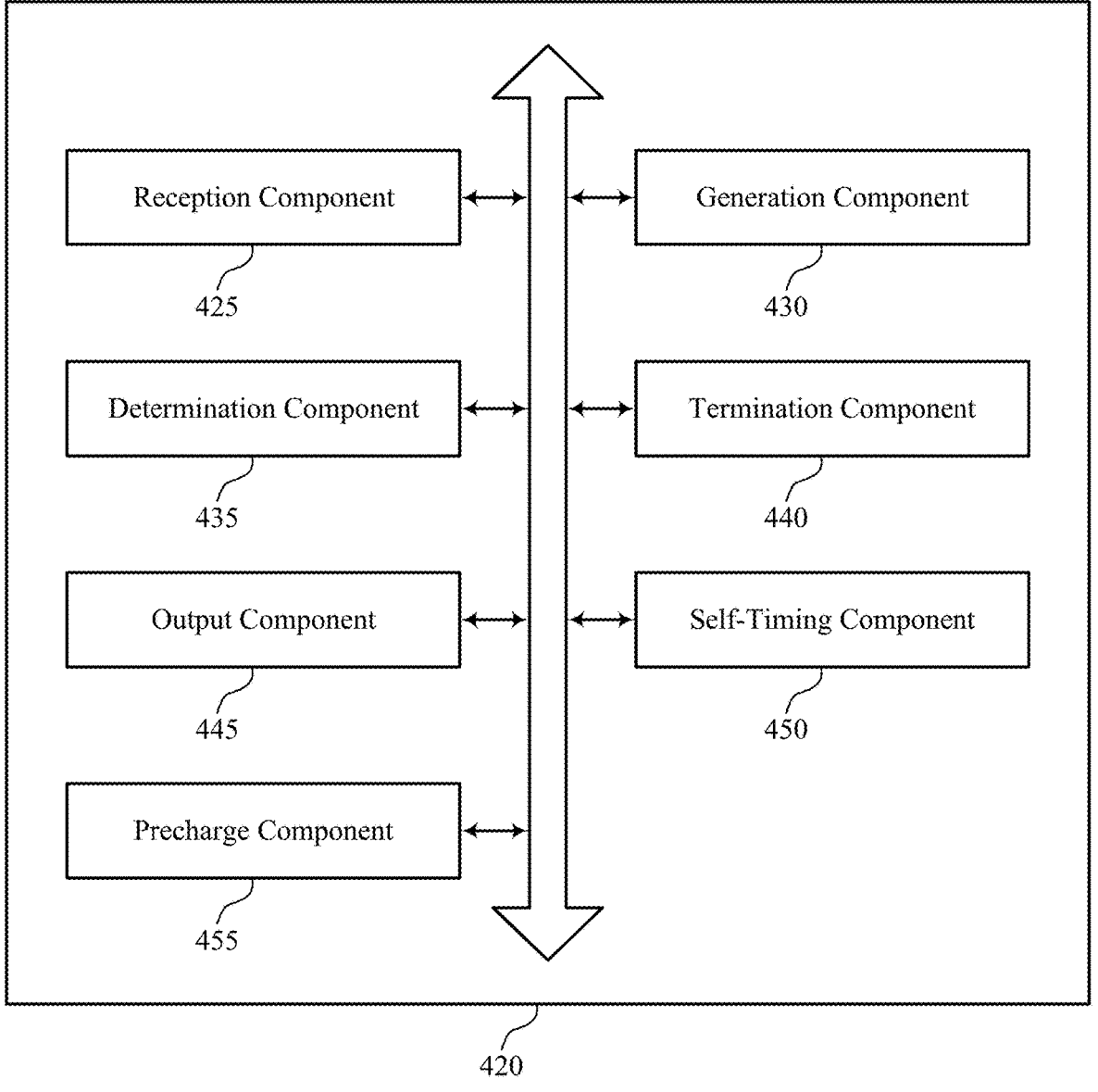
FIG. 4 shows a block diagram of a memory device that supports self-timing read termination in accordance with examples as disclosed herein.

FIG. 4 shows a block diagram 400 of a memory system 420 that supports self-timing read termination in accordance with examples as disclosed herein. The memory system 420 may be an example of aspects of a memory device as described with reference to FIGS. 1 through 3. The memory system 420, or various components thereof, may be an example of means for performing various aspects of self-timing read termination as described herein. For example, the memory system 420 may include a reception component 425, a generation component 430, a determination component 435, a termination component 440, an output component 445, a self-timing component 450, a precharge component 455, or any combination thereof. Each of these components, or components of subcomponents thereof (e.g., one or more processors, one or more memories), may communicate, directly or indirectly, with one another (e.g., via one or more buses).

The reception component 425 may be configured as or otherwise support a means for receiving a command to read data from one or more memory cells of a volatile memory array, the one or more memory cells coupled with a first access line, which is coupled with a first sense component. The generation component 430 may be configured as or otherwise support a means for generating, based at least in part on the command, a first signal to couple the first sense component with a second access line. In some examples, the generation component 430 may be configured as or otherwise support a means for generating, based at least in part on the command, a second signal to couple the second access line with a second sense component during at least a portion of a duration that the second access line is coupled with the first sense component. The determination component 435 may be configured as or otherwise support a means for determining, by the second sense component, one or more logic values of the one or more memory cells based at least in part on coupling the second sense component with the second access line. In some examples, the self-timing component 450 may be configured as or otherwise support a means for generating a third signal to terminate the first signal based at least in part on determining the one or more logic values by the second sense component. The termination component 440 may be configured as or otherwise support a means for terminating the first signal based at least in part on the third signal.

In some examples, the third signal is generated by the second sense component, and the self-timing component 450 may be configured as or otherwise support a means for outputting the third signal from the second sense component to a decoder coupled with the first sense component that generates the first signal, where the first signal is terminated based at least in part on outputting the third signal to the decoder.

In some examples, the self-timing component 450 may be configured as or otherwise support a means for detecting, via a sensor while the second sense component is coupled with the second access line, that a voltage of the second access line satisfies a threshold voltage, where the third signal is generated by the sensor based at least in part on the voltage satisfying the threshold voltage. In some examples, the self-timing component 450 may be configured as or otherwise support a means for outputting the third signal from the sensor to a decoder coupled with the first sense component that generates the first signal, where the first signal is terminated based at least in part on outputting the third signal to the decoder.

In some examples, the self-timing component 450 may be configured as or otherwise support a means for outputting, from the sensor to the second sense component, a fourth signal indicating that the voltage satisfies the threshold voltage, where the one or more logic values are determined by the second sense component based at least in part on receiving the fourth signal.

In some examples, the voltage satisfying the threshold voltage includes the voltage of the second access line dropping to or below the threshold voltage.

In some examples, to support terminating the first signal, the termination component 440 may be configured as or otherwise support a means for terminating, by a decoder coupled with the first sense component, the first signal responsive to receiving the third signal at the decoder to decouple the second access line from the first sense component.

In some examples, the self-timing component 450 may be configured as or otherwise support a means for outputting, by the second sense component, an indication of the one or more logic values based at least in part on determining the one or more logic values, where the third signal is generated based at least in part on outputting the indication.

In some examples, the output component 445 may be configured as or otherwise support a means for outputting, by a decoder, the first signal to the first sense component via a column select line, where the first signal is generated by the decoder based at least in part on receiving the command at the decoder. In some examples, the output component 445 may be configured as or otherwise support a means for outputting, by the decoder, the second signal to the second sense component via a read control line, where the second signal is generated by the decoder based at least in part on receiving the command at the decoder.

In some examples, the first signal is a column select signal and the second signal is a read control signal.

In some examples, the third signal is generated concurrent with the determination of the one or more logic values.

In some examples, the precharge component 455 may be configured as or otherwise support a means for pre-charging, after terminating the first signal, the second access line from a first voltage to a second voltage, where a difference between the first voltage and the second voltage is based at least in part on generating the third signal.

In some examples, the first access line is a bit line and the second access line is a global bit line.

In some examples, the described functionality of the memory system 420, or various components thereof, may be supported by or may refer to at least a portion of at least one processor, where such at least one processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the memory system 420, or various components thereof, may be implemented at least in part by instructions (e.g., stored in memory, non-transitory computer-readable medium) executable by such at least one processor.

FIG. 5 shows a flowchart illustrating a method 500 that supports self-timing read termination in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally, or alternatively, the memory system may perform aspects of the described functions using special-purpose hardware.

At 505, the method may include receiving a command to read data from one or more memory cells of a volatile memory array, the one or more memory cells coupled with a first access line, which is coupled with a first sense component. In some examples, aspects of the operations of 505 may be performed by a reception component 425 as described with reference to FIG. 4.

At 510, the method may include generating, based at least in part on the command, a first signal to couple the first sense component with a second access line. In some examples, aspects of the operations of 510 may be performed by a generation component 430 as described with reference to FIG. 4.

At 515, the method may include generating, based at least in part on the command, a second signal to couple the second access line with a second sense component during at least a portion of a duration that the second access line is coupled with the first sense component. In some examples, aspects of the operations of 515 may be performed by a generation component 430 as described with reference to FIG. 4.

At 520, the method may include determining, by the second sense component, one or more logic values of the one or more memory cells based at least in part on coupling the second sense component with the second access line. In some examples, aspects of the operations of 520 may be performed by a determination component 435 as described with reference to FIG. 4.

At 525, the method may include generating a third signal to terminate the first signal based at least in part on determining the one or more logic values by the second sense component. In some examples, aspects of the operations of 525 may be performed by a self-timing component 450 as described with reference to FIG. 4.

At 530, the method may include terminating the first signal based at least in part on the third signal. In some examples, aspects of the operations of 530 may be performed by a termination component 440 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a command to read data from one or more memory cells of a volatile memory array, the one or more memory cells coupled with a first access line, which is coupled with a first sense component; generating, based at least in part on the command, a first signal to couple the first sense component with a second access line; generating, based at least in part on the command, a second signal to couple the second access line with a second sense component during at least a portion of a duration that the second access line is coupled with the first sense component; determining, by the second sense component, one or more logic values of the one or more memory cells based at least in part on coupling the second sense component with the second access line; generating a third signal to terminate the first signal based at least in part on determining the one or more logic values by the second sense component; and terminating the first signal based at least in part on the third signal.

Aspect 2: The method, apparatus, or non-transitory computer-readable medium of aspect 1, where the third signal is generated by the second sense component and the method, apparatuses, and non-transitory computer-readable medium further includes operations, features, circuitry, logic, means, or instructions, or any combination thereof for outputting the third signal from the second sense component to a decoder coupled with the first sense component that generates the first signal, where the first signal is terminated based at least in part on outputting the third signal to the decoder.

Aspect 3: The method, apparatus, or non-transitory computer-readable medium of aspect 1, further including operations, features, circuitry, logic, means, or instructions, or any combination thereof for detecting, via a sensor while the second sense component is coupled with the second access line, that a voltage of the second access line satisfies a threshold voltage, where the third signal is generated by the sensor based at least in part on the voltage satisfying the threshold voltage and outputting the third signal from the sensor to a decoder coupled with the first sense component that generates the first signal, where the first signal is terminated based at least in part on outputting the third signal to the decoder.

Aspect 4: The method, apparatus, or non-transitory computer-readable medium of aspect 3, further including operations, features, circuitry, logic, means, or instructions, or any combination thereof for outputting, from the sensor to the second sense component, a fourth signal indicating that the voltage satisfies the threshold voltage, where the one or more logic values are determined by the second sense component based at least in part on receiving the fourth signal.

Aspect 5: The method, apparatus, or non-transitory computer-readable medium of any of aspects 3 through 4, where the voltage satisfying the threshold voltage includes the voltage of the second access line dropping to or below the threshold voltage.

Aspect 6: The method, apparatus, or non-transitory computer-readable medium of any of aspects 1 through 5, where terminating the first signal includes operations, features, circuitry, logic, means, or instructions, or any combination thereof for terminating, by a decoder coupled with the first sense component, the first signal responsive to receiving the third signal at the decoder to decouple the second access line from the first sense component.

Aspect 7: The method, apparatus, or non-transitory computer-readable medium of any of aspects 1 through 6, further including operations, features, circuitry, logic, means, or instructions, or any combination thereof for outputting, by the second sense component, an indication of the one or more logic values based at least in part on determining the one or more logic values, where the third signal is generated based at least in part on outputting the indication.

Aspect 8: The method, apparatus, or non-transitory computer-readable medium of any of aspects 1 through 7, further including operations, features, circuitry, logic, means, or instructions, or any combination thereof for outputting, by a decoder, the first signal to the first sense component via a column select line, where the first signal is generated by the decoder based at least in part on receiving the command at the decoder and outputting, by the decoder, the second signal to the second sense component via a read control line, where the second signal is generated by the decoder based at least in part on receiving the command at the decoder.

Aspect 9: The method, apparatus, or non-transitory computer-readable medium of any of aspects 1 through 8, where the first signal is a column select signal and the second signal is a read control signal.

Aspect 10: The method, apparatus, or non-transitory computer-readable medium of any of aspects 1 through 9, where the third signal is generated concurrent with the determination of the one or more logic values.

Aspect 11: The method, apparatus, or non-transitory computer-readable medium of any of aspects 1 through 10, further including operations, features, circuitry, logic, means, or instructions, or any combination thereof for pre-charging, after terminating the first signal, the second access line from a first voltage to a second voltage, where a difference between the first voltage and the second voltage is based at least in part on generating the third signal.

Aspect 12: The method, apparatus, or non-transitory computer-readable medium of any of aspects 1 through 11, where the first access line is a bit line and the second access line is a global bit line.

It should be noted that the aspects described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. A conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or may be an indirect conductive path that includes intermediate components, such as switches, transistors, or other components. In some examples, the flow of signals between the connected components may be interrupted for a time, for example, using one or more intermediate components such as switches or transistors.

The term "isolated" may refer to a relationship between components in which signals are not presently capable of flowing between the components. Components are isolated from each other if there is an open circuit between them. For example, two components separated by a switch that is positioned between the components are isolated from each other when the switch is open. When a component isolates two components, the component may initiate a change that prevents signals from flowing between the other components using a conductive path that previously permitted signals to flow.

The term "coupling" (e.g., "electrically coupling") may refer to condition of moving from an open-circuit relationship between components in which signals are not presently capable of being communicated between the components (e.g., via a conductive path) to a closed-circuit relationship between components in which signals are capable of being communicated between components (e.g., via the conductive path). When a component, such as a controller, couples other components together, the component may initiate a change that allows signals to flow between the other components via a conductive path that previously did not permit signals to flow.

As used herein, including in the claims, the article "a" before a noun is open-ended and understood to refer to "at least one" of those nouns or "one or more" of those nouns. Thus, the terms "a," "at least one," "one or more," and "at least one of one or more" may be interchangeable. For example, if a claim recites "a component" that performs one or more functions, each of the individual functions may be performed by a single component or by any combination of multiple components. Thus, "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components."

A switching component (e.g., a transistor) discussed herein may be a field-effect transistor (FET), and may include a source (e.g., a source terminal), a drain (e.g., a drain terminal), a channel between the source and drain, and a gate (e.g., a gate terminal). A conductivity of the channel may be controlled (e.g., modulated) by applying a voltage to the gate which, in some examples, may result in the channel becoming conductive. A switching component may be an example of an n-type FET or a p-type FET.

The description set forth herein, in connection with the appended drawings, describes example configurations and does not represent all the examples that may be implemented or that are within the scope of the claims. The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Similar components may be distinguished by following the reference label by one or more dashes and additional labeling that distinguishes among the similar components. If just the first reference label is used in the specification, the description is applicable to any one of the similar components having the same first reference label irrespective of the additional reference labels.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Due to the nature of software, functions described herein can be implemented using software executed by a processor, hardware, firmware, hardwiring, or combinations of any of these. Features implementing functions may be physically located at various positions, including being distributed such that portions of functions are implemented at different physical locations.

Illustrative blocks and modules described herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processor. A processor may also be implemented as at least one of one or more computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium, or combination of multiple media, that can be accessed by a computer. By way of example, and not limitation, non-transitory computer-readable media can comprise RAM, ROM, electrically erasable programmable read-only memory (EEPROM), optical disk storage, magnetic disk storage or other magnetic storage devices, or any other non-transitory medium or combination of media that can be used to carry or store desired program code means in the form of instructions or data structures and that can be accessed by a computer, or a processor.

The descriptions and drawings are provided to enable a person having ordinary skill in the art to make or use the disclosure. Various modifications to the disclosure will be apparent to the person having ordinary skill in the art, and the techniques disclosed herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
at least one memory device comprising a volatile memory array; and
at least one controller coupled with the at least one memory device and configured to cause the apparatus to:
    receive a command to read data from one or more memory cells of the volatile memory array, the one or more memory cells coupled with a first access line, which is coupled with a first sense component;
    generate, based at least in part on the command, a first signal to couple the first sense component with a second access line;
    generate, based at least in part on the command, a second signal to couple the second access line with a second sense component during at least a portion of a duration that the second access line is coupled with the first sense component;
    determine, by the second sense component, one or more logic values of the one or more memory cells based at least in part on coupling the second sense component with the second access line;
    generate a third signal to terminate the first signal based at least in part on determining the one or more logic values by the second sense component; and
    terminate the first signal based at least in part on the third signal.

2. The apparatus of claim 1, wherein the third signal is generated by the second sense component, and the at least one controller is further configured to cause the apparatus to:
    output the third signal from the second sense component to a decoder coupled with the first sense component that generates the first signal, wherein the first signal is terminated based at least in part on outputting the third signal to the decoder.

3. The apparatus of claim 1, wherein the at least one controller is further configured to cause the apparatus to:
    detect, via a sensor while the second sense component is coupled with the second access line, that a voltage of the second access line satisfies a threshold voltage, wherein the third signal is generated by the sensor based at least in part on the voltage satisfying the threshold voltage; and
    output the third signal from the sensor to a decoder coupled with the first sense component that generates the first signal, wherein the first signal is terminated based at least in part on outputting the third signal to the decoder.

4. The apparatus of claim 3, wherein the at least one controller is further configured to cause the apparatus to:
    output, from the sensor to the second sense component, a fourth signal indicate that the voltage satisfies the threshold voltage, wherein the one or more logic values are determined by the second sense component based at least in part on receiving the fourth signal.

5. The apparatus of claim 3, wherein the voltage satisfying the threshold voltage comprises the voltage of the second access line dropping to or below the threshold voltage.

6. The apparatus of claim 1, wherein, to terminate the first signal, the at least one controller is configured to cause the apparatus to:
    terminate, by a decoder coupled with the first sense component, the first signal responsive to receiving the third signal at the decoder to decouple the second access line from the first sense component.

7. The apparatus of claim 1, wherein the at least one controller is further configured to cause the apparatus to:
    output, by the second sense component, an indication of the one or more logic values based at least in part on determining the one or more logic values, wherein the third signal is generated based at least in part on outputting the indication.

8. The apparatus of claim 1, wherein the at least one controller is further configured to cause the apparatus to:
    output, by a decoder, the first signal to the first sense component via a column select line, wherein the first signal be generated by the decoder based at least in part on receiving the command at the decoder; and
    output, by the decoder, the second signal to the second sense component via a read control line, wherein the second signal is generated by the decoder based at least in part on receiving the command at the decoder.

9. The apparatus of claim 1, wherein the first signal is a column select signal and the second signal is a read control signal.

10. The apparatus of claim 1, wherein the third signal is generated concurrent with the determination of the one or more logic values.

11. The apparatus of claim 1, wherein the at least one controller is further configured to cause the apparatus to:
    pre-charge, after terminating the first signal, the second access line from a first voltage to a second voltage, wherein a difference between the first voltage and the second voltage is based at least in part on generating the third signal.

12. The apparatus of claim 1, wherein the first access line is a bit line and the second access line is a global bit line.

13. A method, comprising:
    receiving a command to read data from one or more memory cells of a volatile memory array, the one or more memory cells coupled with a first access line, which is coupled with a first sense component;
    generating, based at least in part on the command, a first signal to couple the first sense component with a second access line;
    generating, based at least in part on the command, a second signal to couple the second access line with a second sense component during at least a portion of a duration that the second access line is coupled with the first sense component;
    determining, by the second sense component, one or more logic values of the one or more memory cells based at least in part on coupling the second sense component with the second access line;
    generating a third signal to terminate the first signal based at least in part on determining the one or more logic values by the second sense component; and
    terminating the first signal based at least in part on the third signal.

14. The method of claim 13, wherein the third signal is generated by the second sense component, the method further comprising:
    outputting the third signal from the second sense component to a decoder coupled with the first sense component that generates the first signal, wherein the first signal is terminated based at least in part on outputting the third signal to the decoder.

15. The method of claim 13, further comprising:
    detecting, via a sensor while the second sense component is coupled with the second access line, that a voltage of the second access line satisfies a threshold voltage, wherein the third signal is generated by the sensor based at least in part on the voltage satisfying the threshold voltage; and outputting the third signal from the sensor to a decoder coupled with the first sense component that generates the first signal, wherein the first signal is terminated based at least in part on outputting the third signal to the decoder.

16. The method of claim 15, further comprising:

outputting, from the sensor to the second sense component, a fourth signal indicate that the voltage satisfies the threshold voltage, wherein the one or more logic values are determined by the second sense component based at least in part on receiving the fourth signal.

17. The method of claim 13, further comprising:

terminating, by a decoder coupled with the first sense component, the first signal responsive to receiving the third signal at the decoder to decouple the second access line from the first sense component.

18. The method of claim 13, further comprising:

outputting, by the second sense component, an indication of the one or more logic values based at least in part on determining the one or more logic values, wherein the third signal is generated based at least in part on outputting the indication.

19. The method of claim 13, further comprising:

outputting, by a decoder, the first signal to the first sense component via a column select line, wherein the first signal be generated by the decoder based at least in part on receiving the command at the decoder; and output, by the decoder, the second signal to the second sense component via a read control line, wherein the second signal is generated by the decoder based at least in part on receiving the command at the decoder.

20. A non-transitory computer-readable medium storing code, the code comprising instructions executable by at least one processor to:

receive a command to read data from one or more memory cells of a volatile memory array, the one or more memory cells coupled with a first access line, which is coupled with a first sense component;

generate, based at least in part on the command, a first signal to couple the first sense component with a second access line;

generate, based at least in part on the command, a second signal to couple the second access line with a second sense component during at least a portion of a duration that the second access line is coupled with the first sense component;

determine, by the second sense component, one or more logic values of the one or more memory cells based at least in part on coupling the second sense component with the second access line;

generate a third signal to terminate the first signal based at least in part on determining the one or more logic values by the second sense component; and terminate the first signal based at least in part on the third signal.

* * * * *